US012662994B2

(12) United States Patent (10) Patent No.: US 12,662,994 B2
Kuehn (45) Date of Patent: Jun. 23, 2026

(54) INTEGRATED PLANAR SMA DEVICE AND METHOD

(71) Applicant: STARDUST REDUX LLC, Burnsville, MN (US)

(72) Inventor: Alex Amelia Kuehn, Austin, TX (US)

(73) Assignee: STARDUST REDUX LLC, Burnsvile (MN)

( * ) Notice: Subject to any disclaimer, the term of this patent is extended or adjusted under 35 U.S.C. 154(b) by 171 days.

(21) Appl. No.: 18/378,087

(22) Filed: Oct. 9, 2023

(65) Prior Publication Data

US 2024/0117795 A1 Apr. 11, 2024

Related U.S. Application Data

(60) Provisional application No. 63/414,549, filed on Oct. 9, 2022.

(51) Int. Cl.
*F03G 7/06* (2006.01)
*H05K 1/181* (2026.01)

(52) U.S. Cl.
CPC ......... *F03G 7/06145* (2021.08); *H05K 1/181* (2013.01); *H05K 2201/0308* (2013.01); *H05K 2201/10537* (2013.01)

(58) Field of Classification Search
CPC .................................................. G03G 7/06145
USPC ......................................................... 361/781
See application file for complete search history.

(56) References Cited

U.S. PATENT DOCUMENTS 5,771,742 A 6/1998 Bokaie et al.
2002/0113499 A1* 8/2002 von Behrens ........... F03G 7/062
60/528

FOREIGN PATENT DOCUMENTS

WO WO-2020110091 A2 * 6/2020 ........... E05B 51/005

* cited by examiner

*Primary Examiner* — Stanley Tso
(74) *Attorney, Agent, or Firm* — HULSEY P.C.

(57) ABSTRACT

This disclosure relates generally to a reusable actuating device utilizing multiple integrated planar shape memory alloy elements integrated with independent driver circuits and at least one return spring integrated onto a single multi-layer PCB with a novel layout to create an electrically and mechanically redundant integrated actuator solution uniquely suited for use in low-profile devices that can be utilized by themselves or as an initiator in a staged device to release higher loads. The apparatus of the invention is particularly useful for spacecraft and other vehicular actuation devices.

11 Claims, 3 Drawing Sheets

INTEGRATED PLANAR SMA DEVICE AND METHOD

CROSS-REFERENCE TO RELATED APPLICATIONS

The present application claims the benefit of U.S. Provisional Application No. 63/414,549, filed Oct. 9, 2022; all of which is incorporated in its entirety herein by reference.

FIELD OF THE INVENTION

This disclosure relates generally to a reusable actuating device utilizing multiple integrated planar shape memory alloy elements integrated with independent driver circuits and at least one return spring integrated onto a single multi-layer PCB with a novel layout to create an electrically and mechanically redundant integrated actuator solution uniquely suited for use in low-profile devices that can be utilized by themselves or as an initiator in a staged device to release higher loads.

BACKGROUND

Underwater vehicles, aircraft, launch vehicles and spacecraft have long required specialized actuating devices for various situations. For example, aircraft require actuating devices for the release of bombs or fuel tanks, launch vehicles require actuating devices for separating rocket stages or payloads and spacecraft require actuating devices for releasing solar arrays or antennas amongst other things.

Many actuating devices have been utilized over the years but they all have a variety of shortcomings. The paradox of actuating devices for space applications is that they must be high load carrying, yet light weight, as well as fast acting, but low shock. For example, pyrotechnic bolts have been utilized but have the shortcoming of generating large shock forces and debris upon release even though they are incredibly fast acting and light weight. Various non-pyrotechnic systems (e.g., paraffin actuators, frangible bolts broken with electrically heated elements that expand, burn wires, geared electric motors, etc.) have been utilized with some success but all suffer from various drawbacks. Shape memory alloy actuators which directly produce linear motion or trigger staged mechanisms have been the most successful non-pyrotechnic actuating devices in aerospace due to their relatively low weight, low shock, and reusability when properly designed, but are typically the most complex, bulky, and heavy devices available on the market other than electric motor-based solutions.

Modern SMA actuators for space applications were invented in 1998 by TiNi Aerospace, see U.S. Pat. No. 5,771,742 Bokaie et al. These devices were novel and innovative at the time, but little advance has been made in the proceeding twenty plus years. These devices utilized cylindrical metallic components with complex nested and staged mechanisms, mechanical switch contacts attached to the mechanisms, and external reset devices which made for large bulky actuators that are difficult to manufacture, assemble, and had to be redesigned from the ground up for each specific application.

The disclosed subject matter helps to avoid these and other problems.

SUMMARY

This disclosure relates generally to a reusable actuating device utilizing multiple shape memory alloy elements integrated with independent driver circuits and at least one return spring integrated onto a single multi-layer PCB with a novel layout to create an electrically and mechanically redundant integrated actuator solution uniquely suited to use in low-profile devices that can be utilized by themselves or as an initiator in a staged device to release higher loads.

The main advantage of using the invention is the provision for a novel means of utilizing shape memory alloy elements in a mechanically simple yet highly reliable integrated device that can be built on a single multi-layer printed circuit board with integral driver circuits creating an electrically and mechanically redundant, lightweight, low-profile solution that can be readily adapted to a variety of applications.

DETAILED DESCRIPTION

The inventive device utilizes a single multi-layer printed circuit board on which at least two shape memory alloy elements are collocated such that each element is a mirror of the other, resulting in two elements which will retract the same amount when heated to their transition temperature electrically through the driver circuits and can actuate the output latch.

The output latch is split into at least two halves and mounts to the printed circuit to capture the return spring between the output latch and the bridge plates. The bridge plates clamp the fixed ends of the shape memory alloy elements to the printed circuit board fixing them and causing them to contact conductive patches which connect the elements to the driver circuits.

The driver circuits utilize a MOSFET type switching circuit for each shape memory alloy element or a mechanical switch mounted to the printed circuit board to cut the power to the shape memory alloy element once the device has stroked completely. This circuit is triggered by a spring-loaded bridge wire on each side of the printed circuit board mounted to the output latch and designed to contact conductive end-of-travel pins on each side of the board.

Additionally, a thyristor may be incorporated into the MOSFET switching circuits to make the driver circuits latch to a steady state condition, regardless of the position of the bridge wire and end-of-travel pins once initial contact is made, requiring 5 the power be cycled before the device can be functioned a second time, therefore stopping the shape memory alloy element from overheating and annealing if the device does not have adequate heat sinking to prevent annealing the element during the intermittent switching of the MOSFET during the heating, cooling, 10 and re-stretching cycle perpetuated by the return spring.

The return spring is pre-compressed to a known load and sized such that it applies a nearly constant load to the shape memory alloy element during cooling to re-stretch the element to its original length, causing the device to reset itself once power is no longer applied or once the driver circuit is in the latched state.

Additionally, bypass circuits may be included on the same printed circuit board to allow the end user to elect to use the device without the driver circuits in a single use fashion, or multiple times with a pulse generator, or multiple times with external driver circuits if so desired.

Utilization of the combination of at least two shape memory alloy elements fastened to a single multilayer printed circuit board with bridge components which attach the shape memory alloy elements to independent driver circuits collocated on the board, with a split common output latch which restrains at least one return spring and also provides mounting for a spring loaded bridge wire on each side of the board to trip the driver circuit when contacting end-of-travel pins on the printed circuit board provides the following advantages: 1. An electrically and mechanically redundant device, 2. A consistent stroke length regardless of which circuit is functioned, 3. A lightweight device of minimum part count, 4. A low profile and uniquely shaped actuating device, 5. A reusable device that resets itself.

Some applications of the actuating device include submarine torpedo release mechanisms, submarine door release mechanisms, and underwater cable release mechanisms. Some aviation applications are bomb release mechanisms, fuel tank release mechanisms, parachute release mechanisms, and safety device release mechanisms. Some launch vehicle applications include rocket stage separation systems, payload separation systems and landing gear release mechanisms. Some spacecraft applications include solar array release mechanisms and antenna release mechanisms amongst other things. This can also be used as a trigger mechanism to release energy stored in staged release mechanisms of various types such as those using compressed gas or spring(s) or more.

BRIEF DESCRIPTION OF THE DRAWINGS

A more complete understanding of the invention and the many attendant advantages thereof will be readily appreciated as the same becomes better understood by reference to the following detailed description, when considered in connection with the accompanying drawings wherein.

DESCRIPTION OF THE PREFERRED EMBODIMENT

Figure 1A:
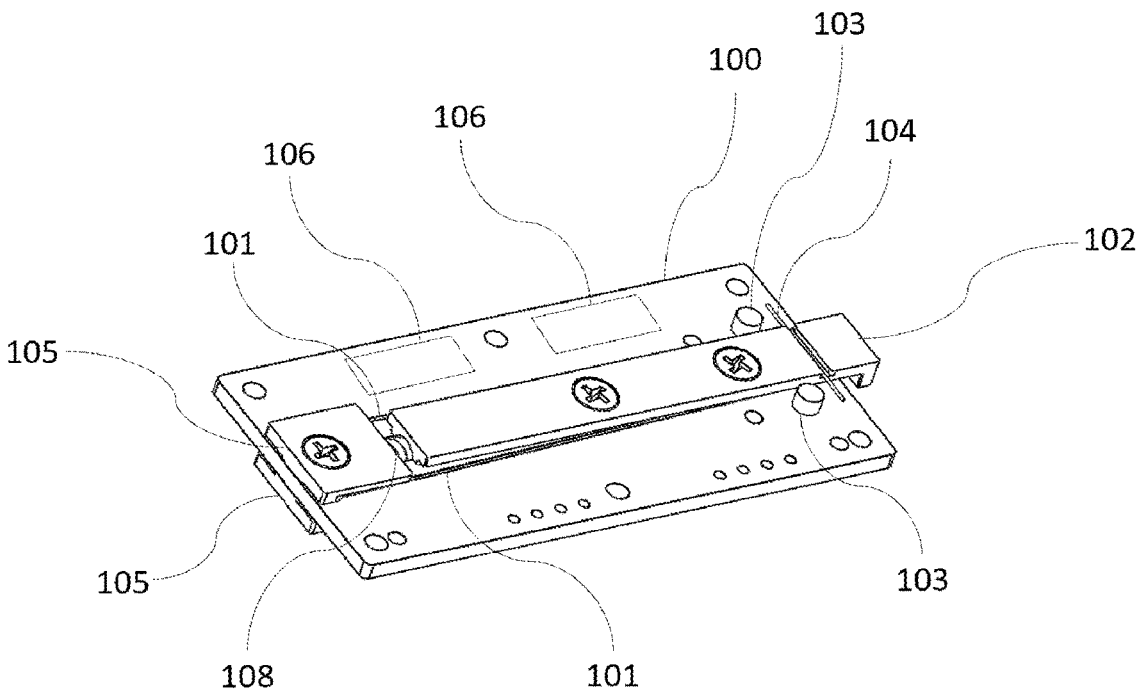
FIG. 1a is an isometric view of the first embodiment while static.

In FIG. 1a the inventive device utilizes a single printed circuit board 100 to collocate the SMA elements 101 with bridge plates 105, driver circuits 106, output latch 102, end-of-travel pins 103. Bridge plate 105 clamp the SMA elements 101 to conductive pads (not shown) embedded in the printed circuit board 100 which are connected via traces (not shown) on an interior layer of the printed circuit board 100 to the driver circuits 106. End-of-travel pins 103 are connected to the driver circuits 106 via traces (not shown) on an interior layer of the printed circuit board. Output latch 102 is fastened to circuit board 100. Bridge wires 104 are attached to output latch halves 102. Return spring 108 is captured between output latch halves 102 and sits in a cutout in printed circuit board 100. It is pushing on output latch halves 102, tensioning SMA elements 101.

Figure 1B:
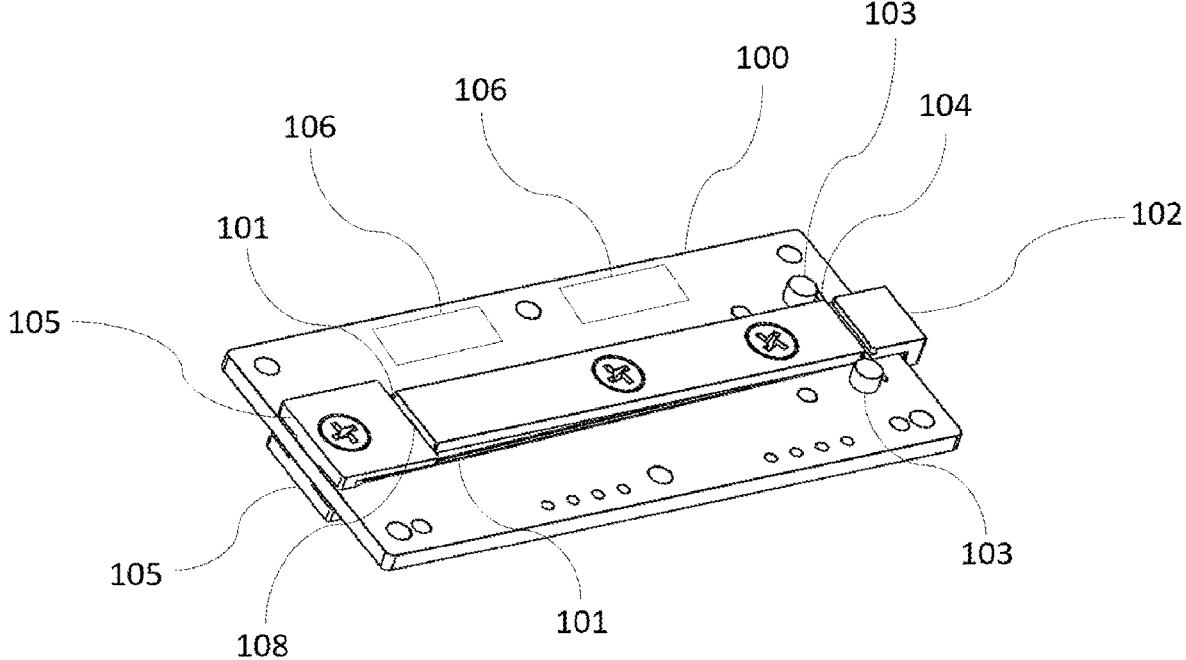
FIG. 1B is an isometric view of the first embodiment while actuated.

In FIG. 1b SMA elements 101 have been heated to or beyond their transition temperature by current applied through driver circuits 106. Output latch halves 102 have retracted due to force exerted by SMA elements 101 reaching their transition temperature. Bridge wires 104 have contacted end-of-travel pins 103 closing the switching circuit in the driver circuits 106 and cutting power to SMA elements 101 to prevent annealing.

Figures 1C, 1D:
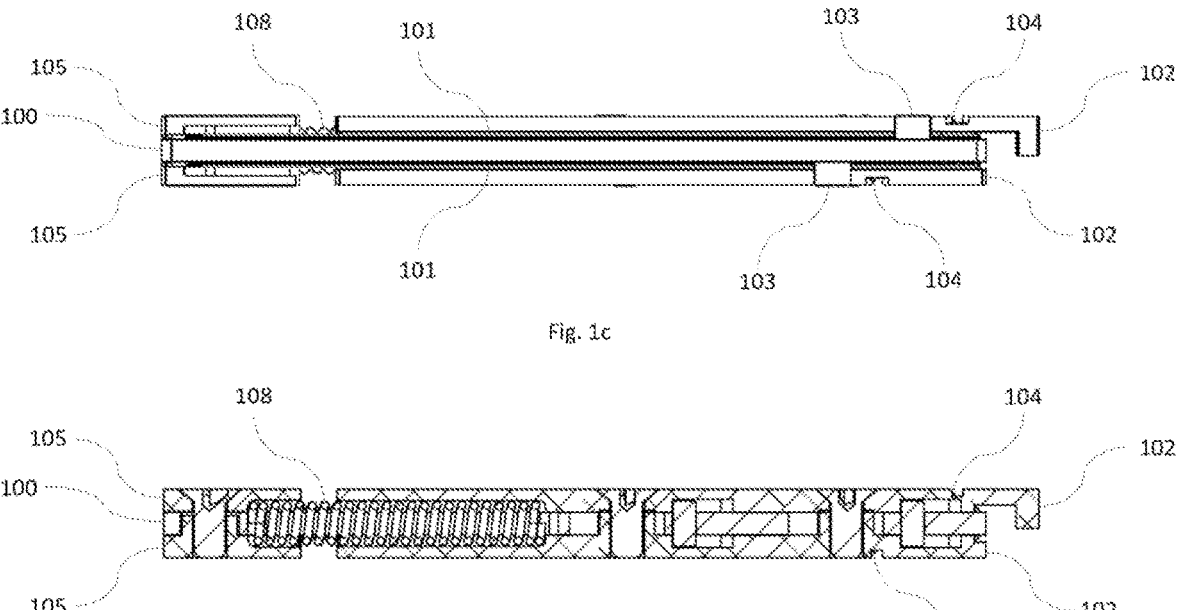
FIG. 1c is a side view of the first embodiment while static.
FIG. 1d is a cutaway view of the first embodiment while static.

In FIG. 1c the inventive device is in its static state and SMA elements 101 can be seen on both sides of printed circuit board 100 captured between output latch halves 102, printed circuit board 100, and are clamped to the printed circuit board 100 by bridge plates 105. End-of-travel pins 103 are attached to printed circuit board 100. Bridge wires 104 are attached to output latch halves 102. A portion of return spring 108 is visible between bridge plates 105 and output latch halves 102.

In FIG. 1d the inventive device is in its static state. Return spring 108 can be seen in printed circuit board 100 cutout being captured between bridge plates 105 and output latch halves 102.

Figure 2A:
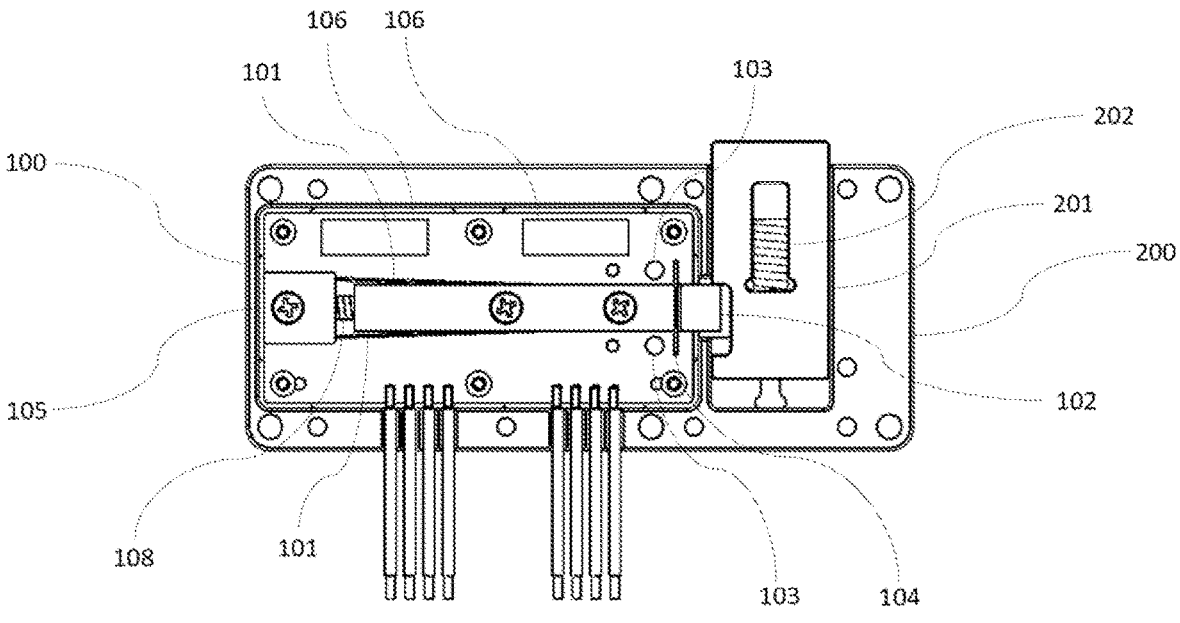
FIG. 2a is a cutaway view of the second embodiment while static.

In FIG. 2a the inventive device utilizes a printed circuit board 100 mounted inside housing 200, collocating it with secondary output latch 201 which is pressed against output latch halves 102 by secondary spring 202 in its compressed state. Output latch halves 102 are held in their static state by return spring 108. Printed circuit board 100 collocates SMA elements 101 with bridge plates 105, driver circuits 106, output latch 102, end-of-travel pins 103. Bridge plate 105 clamp the SMA elements 101 to conductive pads (not shown) embedded in the printed circuit board 100 which are connected via traces (not shown) on an interior layer of the printed circuit board 100 to the driver circuits 106. End-of-travel pins 103 are connected to the driver circuits 106 via traces (not shown) on an interior layer of the printed circuit board. Output latch 102 is fastened to circuit board 100. Bridge wires 104 are attached to output latch halves 102. Return spring 108 is captured between output latch halves 102 and sits in a cutout in printed circuit board 100. It is pushing on output latch halves 102, tensioning SMA elements 101.

Figure 2B:
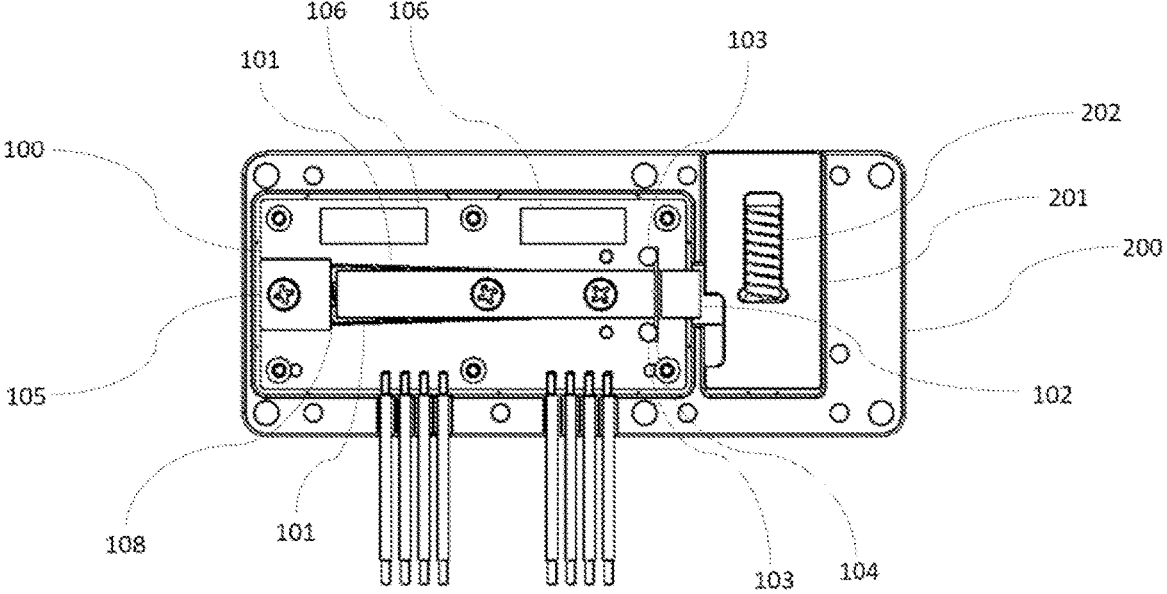
FIG. 2b is a cutaway view of the second embodiment after actuation.

In FIG. 2b SMA elements 101 have been heated to or beyond their transition temperature by current applied through driver circuits 106. Output latch halves 102 have retracted due to forced exerted by SMA elements 101 reaching their transition temperature. Bridge wires 104 have contacted end-of-travel pins 103 closing the switching circuit in the driver circuits 106 and cutting power to SMA elements 101 to prevent annealing. Secondary latch 201 has been retracted by force exerted by secondary spring 202 due to latch halves 102 being retracted beyond interfering with secondary latch 201.

The inventive device enables the creation of mechanically simple, yet highly reliable integrated devices that can be built on a single multi-layer printed circuit board 100 with integral driver circuits 106 creating an electrically and mechanically redundant, lightweight, low-profile solution that can be readily adapted to a variety of applications.

It will be apparent to those skilled in the art that various modifications and variations can be made in the present disclosure without departing from the scope or spirit of the disclosure. Other embodiments of the disclosure will be apparent to those skilled in the art from consideration of the specification and practice of the disclosure disclosed herein. It is intended that the specification and examples be considered as exemplary only, with a true scope and spirit of the disclosure being indicated by the following claims.

What is claimed is:

1. An integrated planar shape memory alloy (SMA) device, comprising:
   a multi-layer printed circuit board (PCB);
   SMA elements;
   an output latch;

bridge components;

a return spring; and driver circuits;

where said SMA elements, said output latch, said bridge components, said return spring and said driver circuits are mounted on said PCB, and wherein said SMA elements cause said output latch to actuate when a current is applied to said SMA elements, wherein said integrated planar SMA device mounts in a housing having a secondary output latch connected by a secondary spring, and wherein said secondary output latch connects said output latch;

and wherein said secondary output latch is pressed against said output latch with the help of said secondary spring to press said output latch causing said SMA elements to heat to or beyond their transition temperature by current applied through said driver circuits.

2. The integrated planar SMA device of claim 1, wherein said output latch is split into at least two output latch halves to mount said PCB and to capture said return spring between said two output latch halves and said bridge components.

3. The integrated planar SMA device of claim 2, wherein said bridge components comprise bridge wires and bridge plates.

4. The integrated planar SMA device of claim 3, wherein said bridge plates clamp fixed ends of said SMA elements to said PCB fixing them and causing them to contact conductive patches which in turn connect said SMA elements to said driver circuits.

5. The integrated planar SMA device of claim 3, further comprises end-of-travel pins, wherein said end-of-travel pins attach to said PCB, and wherein said bridge wires attach to said output latch halves.

6. The integrated planar SMA device of claim 1, wherein said SMA elements are collocated with said PCB such that each SMA element of said SMA elements is a mirror of the other, resulting in two SMA elements that retract the same amount when heated to their transition temperature electrically through said driver circuits and actuate said output latch.

7. The integrated planar SMA device of claim 2, wherein said return spring is pre-compressed to a predetermined load and sized such that said return spring applies a nearly constant load to said SMA elements during cooling to re-stretch said SMA element to its original length, causing said integrated planar SMA device to reset itself once power is no longer applied or once said driver circuits are in a latched state.

8. The integrated planar SMA device of claim 2, wherein said return spring sits in a cut-out in said PCB such that said return spring pushes said output latch halves tensioning said SMA elements.

9. The integrated planar SMA device of claim 3, wherein said SMA elements are heated to or beyond their transition temperature by current applied through said driver circuits.

10. The integrated planar SMA device of claim 9, wherein said output latch halves retract due to the force exerted by said SMA elements when said SMA elements reach their transition temperature.

11. The integrated planar SMA device of claim 9, wherein said bridge wires contact end-of-travel pins attached to said PCB and close a switching circuit in said driver circuits and cut power to said SMA elements to prevent annealing.

\* \* \* \* \*